United States Patent
Bertagnolli et al.

(10) Patent No.: US 6,403,440 B1
(45) Date of Patent: Jun. 11, 2002

(54) METHOD FOR FABRICATING A STACKED CAPACITOR IN A SEMICONDUCTOR CONFIGURATION, AND STACKED CAPACITOR FABRICATED BY THIS METHOD

(75) Inventors: Emmerich Bertagnolli, München; Josef Willer, Riemerling, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/285,897

(22) Filed: Apr. 8, 1999

(30) Foreign Application Priority Data

Apr. 8, 1998 (DE) .......................... 198 15 869

(51) Int. Cl.$^7$ ............................................. H01L 21/20
(52) U.S. Cl. ...................... 438/396; 438/253; 438/254; 438/397
(58) Field of Search ................ 438/239, 253, 438/254, 396, 397, 527, 530, 532

(56) References Cited

U.S. PATENT DOCUMENTS

| | | | |
|---|---|---|---|
| 4,431,460 A | * 2/1984 | Barson et al. | 438/365 |
| 5,053,351 A | 10/1991 | Fazan et al. | 438/240 |
| 5,153,813 A | 10/1992 | Oehrlein et al. | 361/313 |
| 5,637,523 A | 6/1997 | Fazan et al. | 438/397 |
| 5,721,152 A | 2/1998 | Jenq et al. | 438/254 |

FOREIGN PATENT DOCUMENTS

| | | |
|---|---|---|
| DE | 195 46 999 C1 | 4/1997 |
| DE | 195 26 952 C2 | 9/1997 |
| EP | 0 424 623 A2 | 5/1991 |

* cited by examiner

*Primary Examiner*—Stephen D. Meier
*Assistant Examiner*—Jamie L. Brophy
(74) *Attorney, Agent, or Firm*—Herbert L. Lerner; Laurence A. Greenberg; Werner H. Stemer

(57) ABSTRACT

A method for fabricating a stacked capacitor in a semiconductor configuration, in which one electrode of the stacked capacitor is connected via a terminal region of a first conductivity type to a source or drain of a transistor. The semiconductor configuration having one electrode of a stacked capacitor produced by utilizing different etching rates of semiconductor layers of a second conductivity type which are doped to different extents. After the etching of the one electrode of the stacked capacitor, doping reversal of the semiconductor layers remaining after the etching operation to the first conductivity type is performed, with the result that the electrode has the same conductivity type as the terminal region and no pn junction occurs between the electrode and terminal region.

14 Claims, 2 Drawing Sheets

METHOD FOR FABRICATING A STACKED CAPACITOR IN A SEMICONDUCTOR CONFIGURATION, AND STACKED CAPACITOR FABRICATED BY THIS METHOD

BACKGROUND OF THE INVENTION

Field of the Invention

The present invention relates to a method for fabricating a stacked capacitor in a semiconductor configuration in which one electrode of the stacked capacitor is connected via a terminal region of a first conductivity type to a source or drain of a transistor. The one electrode of the stacked capacitor is produced by utilizing different etching rates of semiconductor layers of a second conductivity type which are doped to different extents. In addition, the present invention relates to a stacked capacitor fabricated by this method.

The terms p-doped, $p^+$-doped, $p^-$-doped, n-doped, $n^+$-doped, $n^-$-doped are used synonymously with the abbreviations p-type, $p^+$type, $p^+$-type, $p^-$-type, n-type, $n^+$-type, $n^-$-type, as is customary among those skilled in semiconductor technology.

In the case of a method for fabricating a DRAM cell configuration as disclosed in Published, Non-prosecuted German Patent Application DE 195 26 952 A1, a storage capacitor is disposed in a trench and includes an electrode structure with a plurality of elements with a bulbous configuration and whose surface is provided with a storage dielectric and a counter-electrode. The electrode structure is fabricated by employing the etching of $p^-$-doped polysilicon, which etching is selective with respect to $p^+$-doped polysilicon. Therefore, the fact that $p^-$-doped polysilicon can be etched significantly more rapidly (by a factor of the order of magnitude of 100) compared with $p^+$-doped polysilicon is utilized in this case. In the case of the fabrication of a trench-type storage capacitor disclosed in U.S. Pat. No. 5,153,813, dry etching is performed with alternately oppositely doped semiconductor layers, and the fact that the oppositely doped semiconductor layers have different etching rates is utilized in the process. In this way, the surface and hence the capacitance of the capacitor is enlarged.

U.S. Pat. No. 5,637,523 discloses a method in which, in order to enlarge the capacitor area of a stacked capacitor disposed on a semiconductor body, the capacitor is formed from alternately disposed first and second semiconductor layers, which can be etched differently. Examples of these layers are amorphous or polycrystalline silicon having different doping concentrations.

U.S. Pat. No. 5,053,351 describes a method for fabricating a stacked capacitor for a DRAM cell. In the DRAM cell polycrystalline layers and dielectric layers are applied alternately to a semiconductor body and in which the dielectric layers are then removed in a selective etching step, in order in this way to obtain a capacitor area which is as large as possible.

Finally, German Patent DE 195 46 999 C1 discloses a method for fabricating a stacked capacitor on a semiconductor body provided with a transistor, in which, in a manner similar to that in the method disclosed in Published, Non-prosecuted German Patent Application DE 195 26 952 A1, the selective etchability of $p^+$-doped polysilicon and $p^-$-doped polysilicon is utilized in order to produce a lamellar electrode of the stacked capacitor.

On account of the high selective etchability of $p^+$-type polysilicon and $p^-$-type polysilicon, the last-mentioned method has proved to be particularly successful for producing lamella or laminar structures made of $p^+$-type polysilicon, which is used as the first electrode of the stacked capacitor. In the known method, the electrode firstly has applied to it a dielectric (silicon oxide and/or silicon nitride and/or ON or else ONO etc.), after which the counter-electrode is then formed.

The known method, which is extremely expedient for fabricating a stacked capacitor, has a serious disadvantage, however, for the function of a memory cell using the stacked capacitor. The contact-making of the inner electrode of the stacked capacitor, which electrode is inevitably $p^+$-conducting on account of the etching process, with the source/drain terminal region of the transistor provided in the semiconductor body, which terminal region is $n^+$-conducting for other reasons, is not directly possible. This is because the $p^+n^+$ junction present in this case forms a diode that severely impairs or even completely prevents the functioning of the DRAM cell. For this reason, a concept has been conceived of heretofore which envisages providing a metallic intermediate layer between the $n^+$-conducting source/drain terminal region of the transistor and the $p^+$-conducting electrode of the stacked capacitor, which ensures a resistive connection between the terminal region and the electrode. Although this makes it possible to provide for entirely satisfactory functioning of the memory cell, the introduction of the metallic intermediate layer, which is buried in the layer structure, has turned out to be problematic, since the rest of the process for fabricating the stacked capacitor is thereby altered and requires process variants which have not been able to be resolved heretofore. Even though, therefore, the utilization of the etching selectivity between $p^+$-type polysilicon and $p^-$-type polysilicon is desirable in the fabrication of a stacked capacitor, it has not been possible to date to solve the problems arising with the $p^{30}$ $n^{30}$ junction between the internal $p^+$-type electrode of the stacked capacitor and the $n^+$-type source/drain terminal region, which $p^{30}$ $n^{30}$ junction inevitably occurs in the case of n-channel transistors. Therefore, it has not been possible to date to successfully fabricate stacked capacitors in the context of n-channel transistors by utilizing the selective etchability of $p^+$-type polysilicon and $p^-$-type polysilicon.

SUMMARY OF THE INVENTION

It is accordingly an object of the invention to provide a method for fabricating a stacked capacitor in a semiconductor configuration, and a stacked capacitor fabricated by the method that overcome the above-mentioned disadvantages of the prior art methods and devices of this general type, which utilizes the selective etchability of $p^+$-type polysilicon and $p^-$-type polysilicon and can readily be used with n-channel transistors; in addition, the intention is to provide a stacked capacitor fabricated by the method.

With the foregoing and other objects in view there is provided, in accordance with the invention, a method for fabricating a capacitor in a semiconductor configuration, which includes: providing a transistor with a source/drain region formed in a semiconductor body and a terminal region of a first conductivity type connected to the source/drain region; applying alternating semiconductor layers of different doping concentrations of a second conductivity type including weaker doped layers and stronger doped layers on the terminal region resulting in the alternating semiconductor layers having different etching rates for forming one electrode of a stacked capacitor connected to the terminal region; etching the alternating semiconductor layers resulting in selective removal of some of the alternatively semiconductor layers for forming the one electrode of the stacked capacitor from remaining layers of the alternating semiconductor layers; and performing a doping reversal of the remaining layers remaining after the etching step to the first conductivity type for forming the one electrode of the stacked capacitor.

In the case of the method of the type mentioned in the introduction, the object is achieved according to the invention by virtue of the fact that after the etching of the one electrode of the stacked capacitor, doping reversal of the semiconductor layers remaining after the etching operation to the first conductivity type is performed.

The invention thus follows a path that departs completely from the previous prior art. Instead of adopting special metalizations or measures for ruling out the disadvantages associated with the $p^{30} n^{30}$ junction which is inevitably present between the $p^+$-type electrode and the $n^+$-type terminal region, in the case of the invention the $p^{30} n^{30}$ junction itself is eliminated. For this purpose, after the etching away of the $p^-$-type layer, if appropriate after being covered with a silicon dioxide layer, in a preferred manner the $p^+$-type electrode of the capacitor is first of all subjected to a heat treatment in a vacuum or in a suitable gas atmosphere of nitrogen, during which the $p^+$-type doping is depleted to a great extent across the surface. Specifically, since the thickness of the lamellae of the $p^+$-type electrode is in the region of less than 30 nm, considerable depletion of the $p^+$-type dopant, that is to say boron, occurs during customary heat treatments in the temperature interval between about 750° C. and 1150° C.

Subsequently, the electrode with the depleted p-doping then has its doping reversed by the introduction of, for example, arsenic or phosphorus up to the saturation limit of the semiconductor material, that is to say silicon, or to a point beyond the limit. Ion implantation may preferably be employed for the introduction of the doping-reversal dopant, that is to say arsenic or phosphorus in the present example. However, coating or in-diffusion is also possible.

Following an after treatment of the electrode, for example an annealing step in the case of ion implantation or the removal of the coating, the electrode is provided with an $n^+$-type doping and, consequently, can be connected without difficulty to the terminal region of the transistor or another n-conducting region.

In the explanations above it is assumed that the etching selectivity between the $p^+$-type polysilicon and the $p^-$-type polysilicon is utilized, so that the first conductivity type is n-type conductivity and the second conductivity type is p-type conductivity. However, the present invention can also advantageously be applied when the different etching rates of n-conducting semiconductor layers doped to different extents are used for forming a lamella electrode of a stacked capacitor, in order to enable an n-conducting electrode which is then present to be connected to a $p^+$-type terminal region.

In the preferred exemplary embodiment of the invention, in which a boron-doped electrode has its doping reversed, the fact that boron has distinctly less solid solubility in silicon than arsenic or phosphorus, for example, is advantageously utilized. It is thus possible to perform the doping reversal. An additional fact that is utilized in this case is the fact that the lamellae of the $p^+$-type electrode are so thin that during the aforementioned heat treatment in a vacuum or in a suitable gas atmosphere, even if the lamellae are covered with silicon dioxide or layers containing silicon dioxide, a significant part of the boron diffuses into the vacuum surrounding the electrode, the atmosphere or the silicon-dioxide covering layer and can thus actually be removed even before the doping reversal, for example by ion implantation of arsenic or phosphorus.

A stacked capacitor fabricated by the method according to the invention is distinguished by the fact that residues of a dopant of the second conductivity type are present in at least one of its electrodes made of polycrystalline silicon which is heavily doped with dopant of the first conductivity type.

Other features which are considered as characteristic for the invention are set forth in the appended claims.

Although the invention is illustrated and described herein as embodied in a method for fabricating a stacked capacitor in a semiconductor configuration, and a stacked capacitor fabricated by this method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
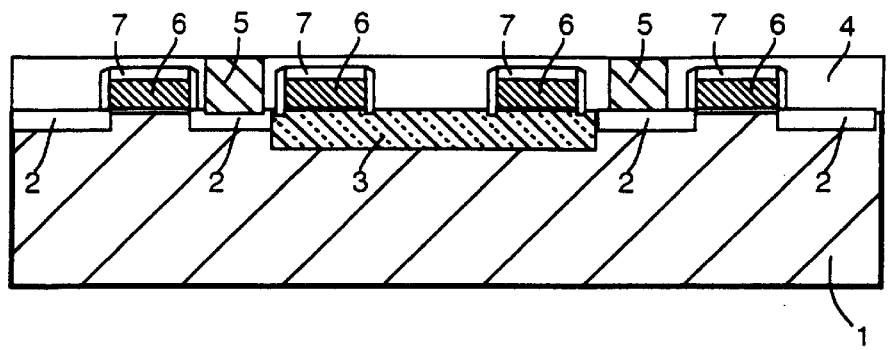
FIGS. 1–7 are diagrammatic, sectional views of individual steps for fabricating a stacked capacitor according to the invention.

Although FIGS. 1 to 7 show sectional views through a semiconductor configuration, hatching of individual parts and/or layers are omitted for reasons of improving the clarity of the invention. In all the figures of the drawing, sub-features and integral parts that correspond to one another bear the same reference symbol in each case. Referring now to the figures of the drawing in detail and first, particularly, to FIG. 1 thereof, there is shown a p-conducting semiconductor body 1, in which $n^+$-conducting source/drain zones 2 are introduced in a customary manner. The source/drain zones 2 of two transistors being alternately isolated by an insulation layer 3. Situated in a silicon dioxide layer 4 disposed on the semiconductor body 1 are $n^+$-conducting terminal regions 5 made of polycrystalline silicon as well as word lines 6 made of n or p-conducting polycrystalline silicon, which run perpendicularly to the plane of the drawing. The word lines 6 are provided with a nitride or oxide encapsulation 7 made of silicon dioxide or silicon nitride.

The semiconductor configuration shown in FIG. 1 is fabricated in a customary manner for example by LOCOS or STI (shallow trench insulation), preferred dimensions being, for example, 8 nm for the gate oxide and 250 nm for the polysilicon layers. The silicon dioxide layer 4 may be composed of, for example, a TEOS layer having a thickness of 300 nm.

Figure 2:
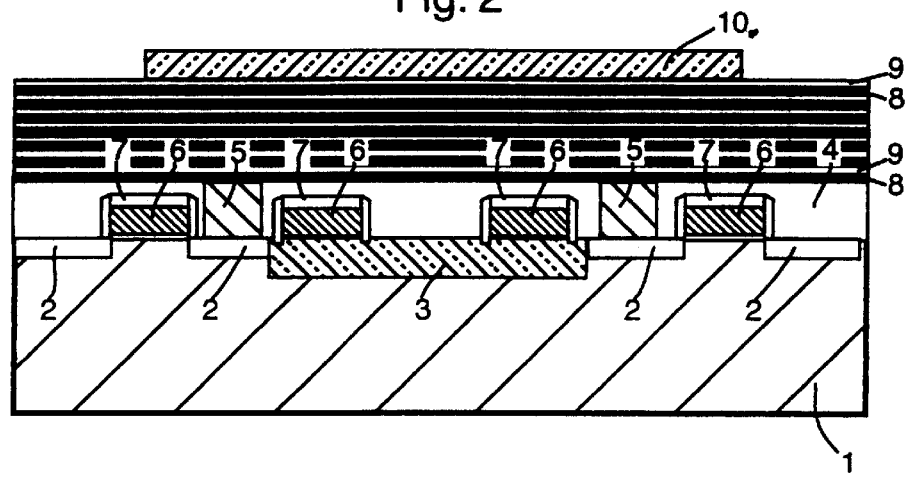
Figure 3:
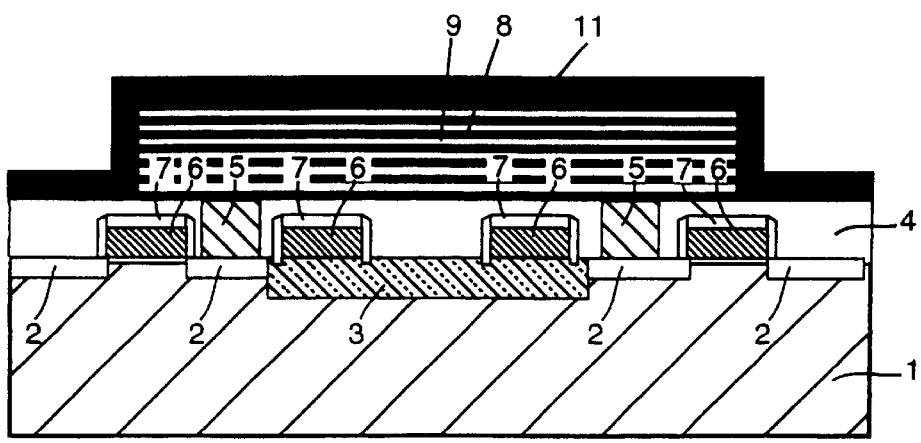

A layer sequence including boron-doped $p^+$-type polysilicon layers 8 and $p^-$-type polysilicon layers 9 is then applied to the structure shown in FIG. 1, as is shown in FIG. 2. This can be done for example by chemical vapor deposition (CVD), in order to obtain a stacked structure of the polysilicon layers 8, 9, which are alternately heavily and weakly doped with boron. The doping of the p⁻-type polysilicon layers results partly from "storage effects": during chemical vapor deposition of the p⁺-type polysilicon layers 8, boron still remains behind in the apparatus used for this purpose to a sufficient extent that after the boron supply is shut off, during the subsequent application of the next polysilicon layer, there is still enough boron present to produce the p⁻-type polysilicon layers 9.

The p⁺-type polysilicon layers 8 and the p⁻-type polysilicon layers 9 are produced with a layer thickness of 20 nm in each case. The dopant concentration of the p⁺-type polysilicon layers 8 is preferably $5 \times 10^{20}$ cm$^{-3}$, and the dopant concentration of the p⁻-type polysilicon layers 9 is $1 \times 10^{19}$ cm$^{-3}$.

A silicon dioxide layer 10 serving as an etching mask is then additionally applied by a photoresist and etching technique (see FIG. 2).

The "outer regions" of the polysilicon layers 8, 9 are etched away with the aid of the silicon dioxide layer 10, the silicon dioxide layer 4 acting as an etching stop. After the removal of the silicon dioxide layer 10, a p⁺-type polysilicon layer 11 is applied to the structure obtained in this way (see FIG. 3). For example, the layer thickness of the polysilicon layer 11 may be 40 nm.

Figure 4:
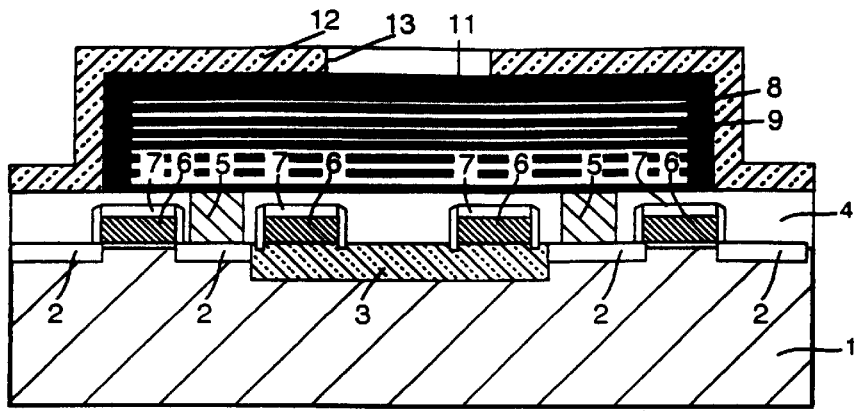

Afterwards, as is shown in FIG. 4, a silicon dioxide layer (TEOS) 12 having a thickness of about 150 nm is applied and into it a window 13 is introduced by customary photoresist and etching technique. The structure shown in FIG. 4 is thus present.

Through the window 13, the regions of the p⁺-type and/or p⁻-type polysilicon layers 11 situated underneath are removed, the surface of the silicon dioxide layer 4 again serving as an etching stop. Once the silicon dioxide layer 12 has been removed, for example by dry etching, the p⁺-type polysilicon layers 8 and the p⁻-type polysilicon layers 9 are etched selectively. In this case, the etching removal of the p⁻-type polysilicon layers 9 is a factor of 100 greater than the etching removal of the p⁺-type polysilicon layers 8. Choline, for example, can be used as the etchant for this purpose.

Figure 5:
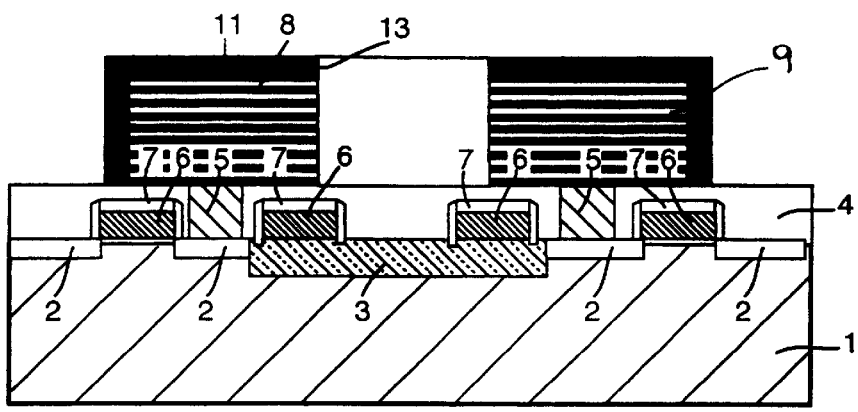
Figure 6:
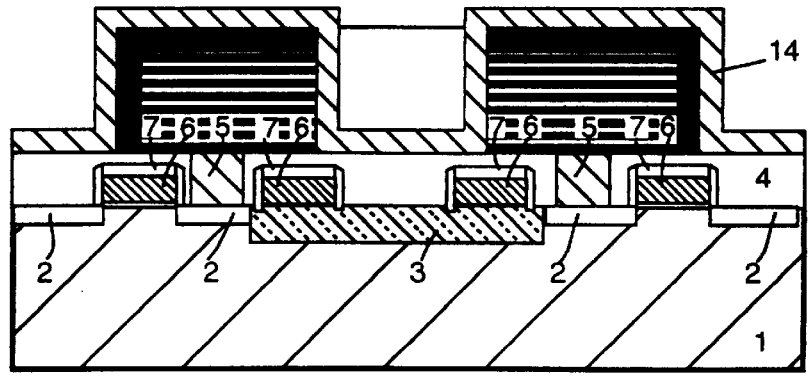
Figure 7:
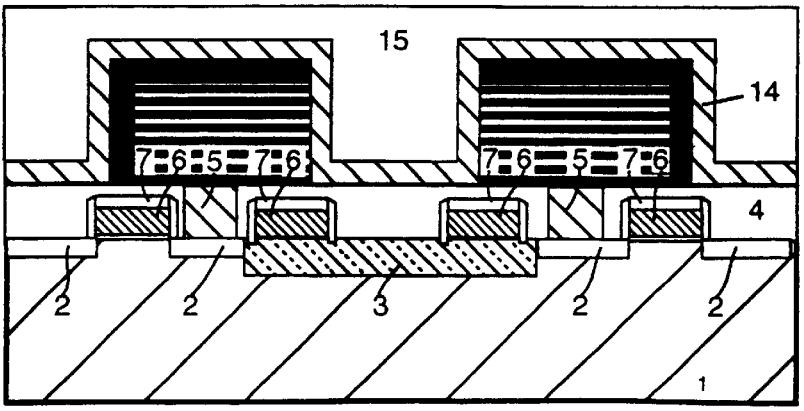

As a result, the configuration shown in FIG. 5 is obtained, in which the p⁺-type polysilicon layers 8 form lamella structures which are surrounded by the p⁺-type polysilicon layer 11 on three sides, that is to say also in front of and behind the plane of the drawing and parallel thereto. Consequently, the lamella structures made of the polysilicon layers 8 are exposed underneath the region of the window 13, as is shown in FIG. 5.

The thickness of the individual lamellae formed by the p⁺-type polysilicon layers 8 is less than 30 nm. Subsequent heat treatment at temperatures of between 750 and 1150° C. then results in a considerable depletion of the dopant boron in the polysilicon layers 8.

The inventive doping reversal of the polysilicon layers 8, 11 which then follows can be performed in different ways. Thus, it is possible to effect this doping reversal by ion implantation, the implantation energy expediently being set in such a way that a maxima occur in each case in the region of the individual lamellae. However, it is also possible to coat the lamellae with a corresponding dopant.

It is likewise possible to apply a thin oxide film to the lamellae prior to the aforementioned heat treatment and only then perform the heat treatment. In this case, the oxide layer forms a dopant sink for the boron during a subsequent temperature treatment.

To summarize, then, the out diffusion of boron from the polysilicon layers 8 can be effected by heat treatment or by coating or oxidation for the purpose of forming a dopant sink and heat treatment. After cleaning (in the case of out diffusion of boron) or removal of the doped surface layer (in the case of coating or oxidation for the purpose of forming the dopant sink), the doping reversal by arsenic or phosphorus is performed. This can be effected by implantation or by coating with arsenic or phosphorus glass and by indiffusion of the dopant.

After a renewed heat treatment, in particular in the case of implantation, the semiconductor configuration shown in FIG. 5 thus has an n⁺-type doping (with phosphorus or arsenic) in the polysilicon layers 8, 11. The doping reversal from boron to phosphorus or arsenic proceeds without major problems since the boron has distinctly less solid solubility in silicon than arsenic or phosphorus. In addition, the doping reversal is promoted by the fact that on account of the small layer thickness of less than 30 nm of the lamella polysilicon layers 8, the depletion in the latter already causes the doping concentration in the layers 8 to decrease greatly prior to the actual doping reversal.

A capacitor dielectric made of ON or ONO layers is then additionally applied, which layers are applied onto the lamella polysilicon layers 8. The ON or ONO layers are not shown in the figure. However, they envelop the surfaces of the polysilicon layers 8, 11, with the result that the latter are dielectrically isolated from a subsequently applied counterelectrode 14 made of n⁺-type polysilicon (see FIG. 6). The layer thickness of the ON or ONO layers is about 3 nm.

After patterning of the n⁺-type polysilicon layer 14, a silicon dioxide layer 15 (TEOS) is additionally applied and planarized, after which the customary metalization processes take place.

What is essential about the invention is the doping reversal of the polysilicon layers 8, 11, which are originally doped with boron, in order to utilize the etching selectivity of weakly and heavily doped p-type polysilicon. The effect achieved by the doping reversal is that the polysilicon layers 8, 11 have the same conductivity type as the terminal region 5, with the result that there is no longer a pn junction between the capacitor electrode formed by the polysilicon layers 8, 11 and the terminal region 5.

We claim:

1. A method for fabricating a capacitor in a semiconductor configuration, which comprises:
    providing a transistor with a source/drain region formed in a semiconductor body and a terminal region of a first conductivity type connected to the source/drain region;
    applying alternating semiconductor layers of different doping concentrations of a second conductivity type including weaker doped layers and stronger doped layers on the terminal region resulting in the alternating semiconductor layers having different etching rates for forming one electrode of a stacked capacitor connected to the terminal region;
    etching the alternating semiconductor layers resulting in selective removal of some of the alternatively semiconductor layers for forming the one electrode of the stacked capacitor from remaining layers of the alternating semiconductor layers; and
    performing a doping reversal of the remaining layers remaining after the etching step to the first conductivity type for forming the one electrode of the stacked capacitor.

2. The method according to claim 1, which comprises using boron as a dopant for the second conductivity type.

3. The method according to claim 2, which comprises performing the doping reversal step by ion implantation of a material selected from the group consisting of arsenic and phosphorus.

4. The method according to claim 2, which comprises performing the doping reversal step by coating the remaining layers with a material selected from the group consisting of arsenic and phosphorus glass.

5. The method according to claim 2, which comprises performing the doping reversal step by indiffusion of a material selected from the group consisting of arsenic and phosphorus.

6. The method according to claim 1, which comprises depleting a dopant of the second conductivity type via a heat treatment before performing the doping reversal step.

7. The method according to claim 6, which comprises carrying out the heat treatment step at between 750 and 1150° C.

8. The method according to claim 1, which comprises performing the doping reversal step to a point beyond a saturation limit of a semiconductor material of the alternating semiconductor layers.

9. The method according claim 6, which comprises coating the remaining layers for forming a dopant sink prior to the heat treatment step for depleting the dopant of the second conductivity type.

10. The method according claim 6, which comprises oxidizing the remaining layers for forming a dopant sink prior to the heat treatment step for depleting the dopant of the second conductivity type.

11. The method according to claim 1, which comprises forming the remaining layers remaining after the etching step to have a layer thickness of less than 30 nm.

12. A semiconductor configuration, comprising:
   a stacked capacitor fabricated by the method according to claim 1, said stacked capacitor having at least one further electrode having dopant residues of said second conductivity type.

13. The semiconductor configuration according to claim 12, wherein said second conductivity type has boron as a dopant.

14. The semiconductor configuration according to claim 12, wherein said one electrode is formed of a dopant selected from the group consisting of arsenic and phosphorus.

* * * * *

UNITED STATES PATENT AND TRADEMARK OFFICE
CERTIFICATE OF CORRECTION

PATENT NO.    : 6,403,440 B1                                              Page 1 of 1
DATED         : June 11, 2002
INVENTOR(S)   : Emmerich Bertagnolli et al.

It is certified that error appears in the above-identified patent and that said Letters Patent is hereby corrected as shown below:

<u>Title page,</u>
Item [75], should read as follows:

-- Inventors:  Emmerich Bertagnolli, Wien (AT);
               Josef Willer, Riemerling (DE). --

Signed and Sealed this

Twelfth Day of November, 2002

Attest:

Attesting Officer

JAMES E. ROGAN
*Director of the United States Patent and Trademark Office*